(12) United States Patent
Jdira et al.

(10) Patent No.: US 8,398,773 B2
(45) Date of Patent: Mar. 19, 2013

(54) THERMAL PROCESSING FURNACE AND LINER FOR THE SAME

(75) Inventors: Lucian C. Jdira, Almere (NL); Noureddine Adjeroud, Almere (NL)

(73) Assignee: ASM International N.V., Almere (NL)

( * ) Notice: Subject to any disclaimer, the term of this patent is extended or adjusted under 35 U.S.C. 154(b) by 69 days.

(21) Appl. No.: 13/011,442

(22) Filed: Jan. 21, 2011

(65) Prior Publication Data

US 2012/0186573 A1 Jul. 26, 2012

(51) Int. Cl.
*C23C 16/00* (2006.01)
*C23C 16/455* (2006.01)

(52) U.S. Cl. ........ 118/724; 118/715; 118/725; 432/241; 432/254.2; 432/193; 432/194; 432/120

(58) Field of Classification Search .................. 118/724, 118/725, 715; 432/241, 254.2, 193, 194, 432/120
See application file for complete search history.

(56) References Cited

U.S. PATENT DOCUMENTS

| | | | | |
|---|---|---|---|---|
| 3,875,068 A * | 4/1975 | Mitzel | ....................... | 422/186.05 |
| 4,508,054 A * | 4/1985 | Baumberger et al. | .......... | 118/718 |
| 4,638,762 A * | 1/1987 | Kim et al. | ...................... | 118/725 |
| 5,318,632 A * | 6/1994 | Onodera | ........................ | 118/715 |
| 5,320,680 A * | 6/1994 | Learn et al. | ..................... | 118/724 |
| 5,846,073 A * | 12/1998 | Weaver | .......................... | 432/241 |
| 5,908,292 A * | 6/1999 | Smith et al. | ................... | 432/197 |
| 6,495,473 B2 | 12/2002 | Taniyama et al. | | |
| 6,503,079 B2 | 1/2003 | Kogano et al. | | |
| 7,736,437 B2 | 6/2010 | Cadwell et al. | | |
| 2009/0308315 A1 | 12/2009 | De Ridder | | |
| 2012/0186573 A1* | 7/2012 | Jdira et al. | ...................... | 126/58 |

* cited by examiner

*Primary Examiner* — Jeffrie R Lund
(74) *Attorney, Agent, or Firm* — Preti Flaherty Beliveau & Pachios LLP

(57) ABSTRACT

A thermal processing furnace, comprising:
- a generally bell jar-shaped outer reaction tube having a central axis; and
- an open-ended inner reaction tube for accommodating a wafer boat holding a plurality of substrates, which inner reaction tube is substantially coaxially disposed within the outer reaction tube, thereby defining a gas passage between an outer wall of the inner reaction tube and an inner wall of the outer reaction tube, wherein at least one of the outer wall of the inner reaction tube and the inner wall of the outer reaction tube is provided with a flow deflector that protrudes radially from the respective wall into the gas passage.

13 Claims, 3 Drawing Sheets

THERMAL PROCESSING FURNACE AND LINER FOR THE SAME

FIELD OF THE INVENTION

The present invention generally relates to equipment for processing semiconductor substrates, and more in particular to a vertical thermal processing furnace and a liner for use therein.

BACKGROUND

Thermal processing furnaces or reactors are commonly used for batch processing semiconductor wafers during several fabrication stages of silicon integrated circuits. Processing steps for which a furnace may be used include oxidation, diffusion, annealing and chemical vapor deposition (CVD) and pulsed atomic layer deposition (ALD).

A conventional vertical thermal processing furnace may include a thermally resistive heating coil, powered by an electrical power supply. Within the heating coil there may be provided a bell jar-shaped outer reaction tube and an inner reaction tube that is coaxially disposed within the outer reaction tube. The inner reaction tube is commonly referred to as the liner. The lower end of the outer reaction tube may be open, while the upper end thereof may be closed, typically by a dome-shaped structure. The liner may be open at both its lower and upper end. The lower ends of both the outer reaction tube and the liner may be supported on a flange, which may define a central furnace opening via which a wafer boat holding a plurality of wafers may enter and exit the reaction chamber that is formed by the interior of the liner. The wafer boat may be supported on a thermally insulating pedestal, which in turn may be supported on a door plate that may serve to close off the central furnace opening in the flange. The flange may further be provided with a gas feed conduit that connects to a gas injector disposed inside the liner, and a gas exhaust conduit via which a vacuum pump may be connected to a lower end of the gas passage that exists between an outer wall of the liner and an inner wall of the outer reaction tube.

In operation, a wafer boat may be introduced into the reaction chamber, which may then be evacuated. Subsequently, a process gas may be fed to the reaction chamber via the gas feed conduit and the gas injector. The process gas may flow upwardly within the inner reaction tube while contacting the wafers provided therein. As the process gas exits the upper end of the inner reaction tube and reaches the closed upper end of the outer reaction tube, it may reverse its direction and flow downwardly through the gas passage between the inner and outer reaction tubes, so as to be exhausted from the reaction chamber via the gas exhaust conduit by the vacuum pump.

A general problem associated with thermal processing furnaces is contamination of the reaction chamber atmosphere with small particles. A particle that ends up on a wafer being processed may render a die to be manufactured therefrom inoperable. Contamination of the reaction chamber atmosphere may have different causes.

U.S. Pat. No. 7,736,437 expresses the belief that the dome of a quartz, bell jar-shaped outer reaction tube generates a significant number of micro-particles when it is heated. In operation, these particles may fall into the upper, open end of the inner reaction tube and thence onto the wafer boat and the wafers supported therein. To prevent this, U.S. '437 teaches the use of a cover that is to be disposed on top of the inner reaction tube. The cover may include apertures, such as convolute passageways, in order to allow a substantial upward flow of process gas therethrough while blocking most particles from the dome from falling to within the inner reaction tube.

U.S. Pat. No. 6,503,079 identifies the furnace opening portion of a thermal processing furnace, and more in particular outgassing O-rings, leaking seals and wafer boat rotation mechanisms in the furnace opening portion, as possible sources of contamination. Since the furnace opening portion is located upstream of a flow of process gas within the reaction chamber, the process gas introduced into the reaction chamber may serve as a carrier for the contaminants generated by the aforementioned sources in the furnace opening portion. The contaminants may thus be deposited on and/or adhere to any wafers present in the reaction chamber. Obviously, this may hinder film growth and inhibit process reactions, and so form a cause of poor film quality. To prevent contamination of the reaction chamber, U.S. '079 teaches the use of a reverse-diffusion preventing body, disposed between the reaction chamber and a furnace opening portion space at a side of the furnace opening, within the furnace. In addition, two independently operable gas exhaust systems are provided: a process gas exhaust system for exhausting process gas from the reaction chamber, and a purge gas exhaust system for exhausting purge gas from the furnace opening portion space. The contaminating furnace opening portion is thus being isolated from the reaction chamber by the reverse-diffusion preventing body, while both the reaction chamber and the furnace opening portion space are both provided with their own gas flow management. This combination of features makes it possible to prevent diffusion of a contaminant from the furnace opening portion space to the reaction chamber, and hence to the wafers.

SUMMARY OF THE INVENTION

Research by applicant to further improve the performance of her thermal processing furnaces has revealed that another, yet unrecognized cause of contamination of the reaction chamber atmosphere exists.

The source of the contamination appears to lie partly in the fact that process gases tend to form a deposit when they are being exhausted via the relatively cold lower portion of the furnace, which includes the flange and the gas exhaust conduit. For instance, when TEOS (tetraethyl orthosilicate, $Si(OC_2H_5)$), which may be employed as a precursor in the low pressure chemical vapor deposition of a silicon dioxide ($SiO_2$) film, is exhausted from the reaction chamber, together with reaction by-products, it is observed to form solid and/or viscous-liquid by-products. These by-products are the result of complex chemical (surface) reactions at the lower temperatures in the downstream part of the furnace, and deposit on the flange and in the gas exhaust conduit. Another process in which accumulation of deposit in the downstream part of the furnace is reported is the low pressure chemical vapor deposition of silicon nitride.

In itself the deposition of by-products adjacent the downstream end of the gas exhaust path, i.e. on the flange and in the gas exhaust conduit, does not cause contamination of the reaction chamber. It seems, however, that material deposited at the downstream end of the gas exhaust path may be whirled up and transported back, through the gas passage, into the reaction chamber by recirculating gas flows. During normal operation of a thermal processing furnace such recirculating gas flows are unlikely to occur, both because of the low pressure at which processes are typically carried out and the pressure gradient along the gas exhaust path that is imposed and maintained by the vacuum pump. There are situations, however, during which these factors do not prevent the backflow of deposit. For instance, when, after discharging one wafer boat holding processed wafers from the reaction chamber another wafer boat with a fresh batch of wafers is being loaded into the reaction chamber, the reaction chamber may be at atmospheric pressure and the vacuum pumps may be temporarily switched off. The introduction of the new, relatively cold wafer boat with the likewise cold unprocessed wafers into the relatively warm reaction chamber may cause significant temperature gradients within the reaction chamber, in particular between the outer reaction tube, the liner and the wafer boat. These temperature gradients may induce pressure gradients, which may in turn drive convective flows over the liner. These flows may facilitate particle transport from the downstream end of the exhaust path, via the gas passage, back into the reactor chamber. This way, particles may end up on the wafers, in particular those near the top of the wafer boat.

It an object of the present invention to provide for a thermal processing furnace in which the above-mentioned problem of backflow of material that has been deposited at the downstream end of the gas exhaust path is overcome or mitigated.

It is another object of the present invention to provide for a liner that may be installed in a conventional thermal processing furnace (possibly as a replacement for the originally installed liner) so as to overcome or mitigate the problem of backflow of material deposited near the downstream end of the gas exhaust path.

One aspect of the present invention is directed to a thermal processing furnace. The thermal processing furnace may include a generally bell jar-shaped outer reaction tube having a central axis. It may further include an open-ended inner reaction tube for accommodating a wafer boat holding a plurality of substrates. The inner reaction tube is substantially coaxially disposed within the outer reaction tube, thereby defining a gas passage between an outer wall of the inner reaction tube and an inner wall of the outer reaction tube. At least one of the outer wall of the inner reaction tube and the inner wall of the outer reaction tube may be provided with a flow deflector that protrudes radially from the respective wall into the gas passage.

Another aspect of the present invention is directed to an inner reaction tube for installation and use in a thermal processing furnace of the double-tube type. The inner reaction tube may comprise a generally tubular wall having a central axis, which tubular wall may be provided with a flow deflector that protrudes radially outwardly therefrom.

In the thermal processing furnace according to the present invention, the inner wall of the outer reaction tube and/or the outer wall of the liner may be provided with a flow deflector. The flow deflector, which may take any suitable form (e.g. one or more protrusions, ridges, (cantilever-like) baffles, etc.), may protrude from the respective wall into the gas passage in a substantially radial direction with respect to the central axis of the furnace. The flow deflector's primary purpose is to obstruct, e.g. deflect or break down, somewhat turbulent or erratic upwardly directed gas flows carrying contaminating particles through the gas passage towards the reaction chamber.

In one embodiment the flow deflector may—seen in the direction of the central axis—encircle the inner reaction tube, such that a gas flow through the gas passage in the upward direction of the central axis is obstructed at least once by said flow deflector, irrespective of the angular position of the gas flow relative to the central axis, In another embodiment, the flow deflector may protrude radially from the respective wall by a distance of at least 75% of a local width of the gas passage, so as to warrant sufficient gas flow obstruction. In an embodiment wherein the flow deflector encircles the inner reaction tube, it may preferably protrude from the respective wall by said distance of 75% of the local width of the gas passage over at least one full encirclement.

In yet another embodiment, the flow deflector may extend along, or be distributed over, the axial length of the inner reaction tube, such that the flow deflector extends (i.e. is present) in all of three equally long axially extending portions of the gas passage that together cover a total length thereof. Such distribution or spreading of the flow deflector over the axial length of the gas passage helps to minimize the size of axial gas passage portions in which strong, upwardly directed gas flows may develop in the absence of by the flow deflector.

These and other features and advantages of the invention will be more fully understood from the following detailed description of certain embodiments of the invention, taken together with the accompanying drawings, which are meant to illustrate and not to limit the invention.

DETAILED DESCRIPTION OF THE INVENTION

Figure 1:
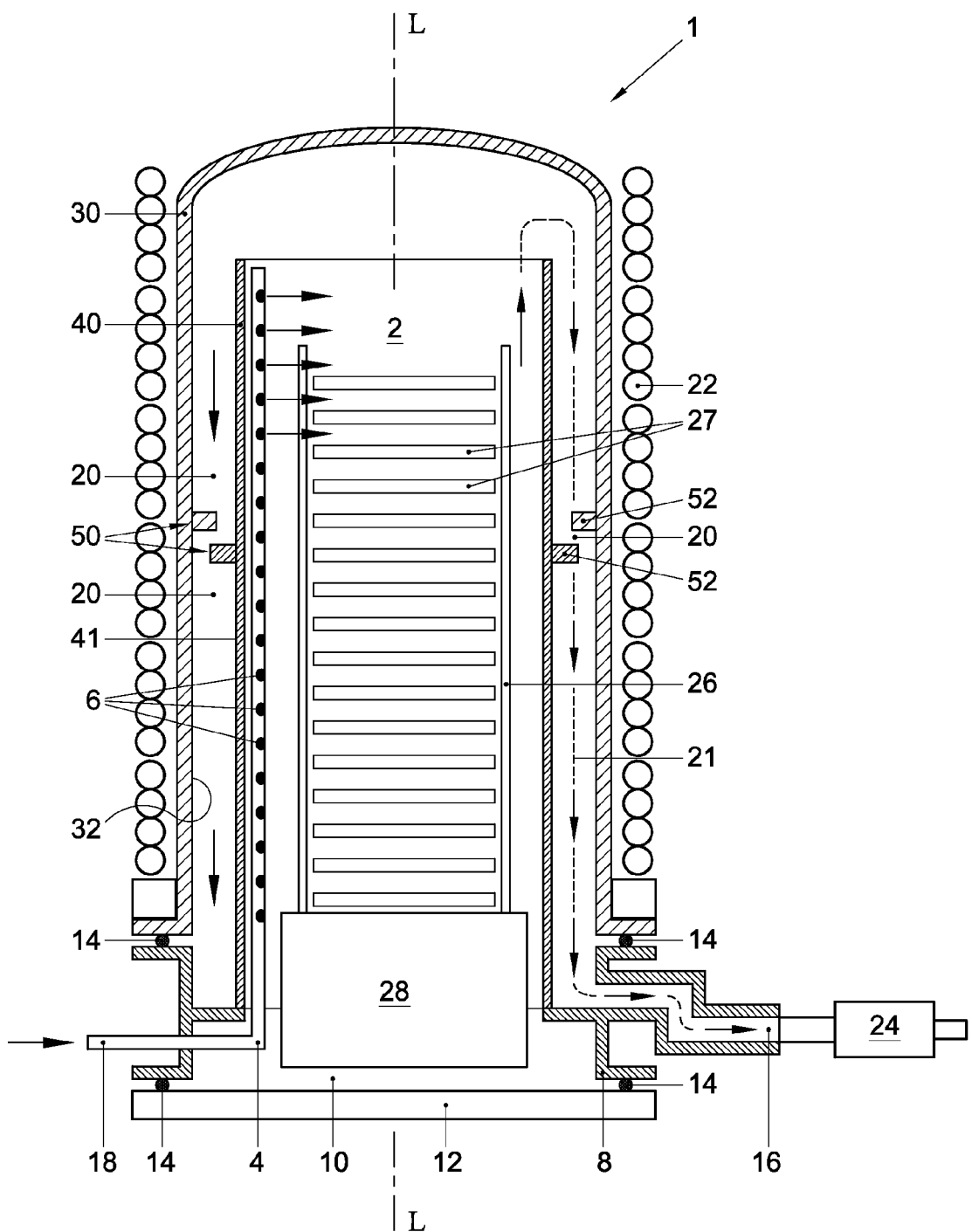
FIG. 1 is a schematic cross-sectional side view of an exemplary embodiment of a thermal processing furnace according to the present invention.

FIG. 1 schematically illustrates in a cross-sectional side view an exemplary vertical thermal processing furnace or reactor 1 according to the present invention. The furnace 1 is of a double tube type, and includes a generally bell jar-shaped outer reaction tube 30 and an open-ended inner reaction tube 40. The inner reaction tube 40 may alternatively be referred to as the liner. The outer reaction tube 30 may be surrounded by heating means, such as a thermally resistive heating coil 22 that is powered by an electrical power supply (not shown). The heating means may further be secured to a thermally insulating sleeve (not shown) that surrounds the outer reaction tube 30. Both reaction tubes 30, 40 may have a generally tubular, for example circular or polygonal, cross-sectional shape. An outer diameter of the inner tube 40 may be smaller than an inner diameter of the outer reaction tube 30. Accordingly, the inner reaction tube 40 may be at least partially disposed within the outer reaction tube 30, and extend substantially coaxially therewith around a common central axis L. A gas passage 20 may be defined between an inner wall 32 of the outer reaction tube 30 and an outer wall 41 of the inner reaction tube 40. In case the reaction tubes 30, 40 have a similar cross-sectional shape, the gas passage 20 may have a uniform width along its axial length. The (average) width of the gas passage may typically be on the order of several centimeters, e.g. in the range of 1-5 centimeters. Both tubes 30, 40 may be made of quartz, silicon carbide, silicon or another suitable heat resistant material.

In the configuration shown in FIG. 1 the inner reaction tube 40 may delimit a reaction chamber 2 in which a wafer boat 26 is receivable. At their lower ends, both the outer and inner reaction tube 30, 40 may be supported on a flange 8, which may be made of stainless steel. The wafer boat 26 may enter and/or exit the reaction chamber 2 via a central furnace opening 10 provided in the flange 8. The wafer boat 26, which may include a plurality, e.g. between 50 and 150, of slots for holding equally many semiconductor wafers 27, may be mounted on a (sleeveless) pedestal 28 that itself may be mounted on a seal cap or door plate 12. The pedestal 28 may act as a heat shield for both the door plate 12 and the flange 8, and reduce heat loss via the lower portion of the furnace 1. In some embodiments, the wafer boat 26 and the pedestal 28 may be rotatable by motor means (not shown).

To ensure that the reaction chamber 2 is sealed in a gas-tight manner, several elastomeric O-rings 14 may be employed in the lower part of the furnace 1, in particular between the outer reaction tube 30 and the flange 8, and between the flange 8 and the door plate 12. Since the reliability of elastomeric O-rings and other seals may diminish when subjected frequently or continuously to high temperatures, the lower part of the furnace 1 may preferably be kept at a lower temperature than that present in the central and upper parts of the reaction chamber 2.

The furnace 1 may further include a gas injector 4. The gas injector 4 may be disposed within reaction chamber 2 and include a plurality of gas injection holes 6 provided over the height or axial length of the wafer boat 26. A gas feed conduit 18 may connect to the gas injector 4, possibly via the flange 8, so as to enable the introduction of process gases, e.g. precursor and/or purge gases, into the reaction chamber 2 from the gas injection holes 6.

To discharge or exhaust gas from the reaction chamber 2, a gas exhaust conduit 16 may be fluidly connected to a lower or downstream end of the gas passage 20, possibly via the flange 8 (as schematically shown in FIG. 1). A downstream end of the gas exhaust conduit 16 may be connected to a suction side of a vacuum pump 24.

During normal operation, gas introduced into the reaction chamber 2 from the holes 6 of the gas injector 4 flows generally upwardly inside the reaction chamber. It turns around at the open upper end of the inner tube 40, and then flows downwardly through the gas passage 20 between the outer and inner tubes 30, 40, towards the gas exhaust conduit 16 connected to the vacuum pump 24. In FIG. 1 this gas exhaust path is indicated with reference numeral 21. While being exhausted, reactive gases may form a deposit as they flow through the relatively cold lower portion of the furnace 1, which includes the flange 8 and the gas exhaust conduit 16 (in the embodiment of FIG. 1 a part of the flange 8).

In itself the deposition of by-products adjacent the downstream end of the gas exhaust path 21 does not cause contamination of the reaction chamber 2. Under certain conditions, however, material deposited at the downstream end of the gas exhaust path 21 may be whirled up and be transported back, via the gas passage 20, into the reaction chamber 2 by recirculating gas flows. For instance, when after discharging one wafer boat 26 holding processed wafers 27 from the reaction chamber 2 another wafer boat with a fresh batch of wafers 27 is being loaded into the reaction chamber 2, the reaction chamber 2 may be at atmospheric pressure and the vacuum pump 24 may be temporarily switched off. The introduction of the new, relatively cold wafer boat 26 with the likewise cold unprocessed wafers 27 into the relatively warm reaction chamber 2 may cause significant temperature gradients within the reaction chamber, in particular between the outer reaction tube 40, the inner reaction tube 30 and the wafer boat 26. These temperature gradients may induce pressure gradients and/or gas density gradients, which may in turn drive convective flows over the inner reaction tube 30. These flows may facilitate particle transport from the downstream end of the exhaust path 21, via the gas passage 20, back into the reactor chamber. 2 This way, particles may end up on the wafers 27, in particular those disposed near the top of the newly introduced wafer boat 26.

To prevent such back flow of deposit, the outer wall 41 of the inner reaction tube 40 and/or the inner wall 32 of the outer reaction tube 30 may be provided with a flow deflector 50. The flow deflector 50 may protrude from the respective wall into the gas passage 20, in a generally radial direction with respect to the central axis L of the reaction tubes 30, 40.

In the thermal furnace 1 of FIG. 1 both the outer reaction tube 30 and the inner reaction tube 40 are provided with a flow deflector 50 in the form of a single annular baffle 52 that protrudes radially into the gas passage 20. The flow deflectors 50 are provided at a point about halfway the axial length of the gas passage 20, and sufficiently close to each other to define a narrow Z-shaped gap between themselves and the walls 32, 41 through which gas may pass. The baffles 52 of the flow deflectors 50 encircle or surround the inner reaction tube 40, such that they necessarily obstruct the flow of gas through the gas passage 20 in the direction of the central axis L, irrespective of the angular position of the gas flow relative to the central axis.

It will be clear that the annular baffles 52 in the embodiment of FIG. 1 encircle the inner reaction tube 40. With an eye to some more elaborate flow deflector embodiments, however, the following is noted. Whether or not a flow deflector encircles the inner reaction tube 40 (at least once) may be best judged by viewing the double tube structure 30,40 in the direction of the central axis L. In such an axial view, a flow deflector that encircles the inner tube 40 will normally be visible, and be seen to extend through an angle of 360° around the axis L. Hence, to encircle the inner tube 40 it is no requirement that the flow deflector extends around that tube at a single axial position, such as the baffles 52 in FIG. 1. Neither is it necessary for the flow deflector to consist of a single part. As will be illustrated with reference to FIGS. 2 and 3, a flow deflector may be composed of multiple parts, e.g. baffles, that may be provided at different axial positions, which parts together encircle the inner tube 40 in the sense just defined.

In order to warrant an efficient obstruction of a backflow, a flow deflector 50 may preferably protrude sufficiently far into the gas passage 20. Precisely what is 'sufficiently far' may depend in particular on the (local) width of the gas passage 20, i.e. on the (local) distance between the inner wall 32 of the outer reaction tube 30 and the outer wall 41 of the inner reaction tube 40. In general, the flow deflector 50 may preferably protrude radially from the wall on which it is provided over a radial distance of at least 75% of a local width of the gas passage 20. For example, in case the outer and inner reaction tubes 30, 40 define a cylinder jacket-shaped gas passage 20 with a uniform width of 25 millimeters along the central axis L, the flow deflector 50 may preferably extend a radial distance of at least 19 millimeters (i.e. 0.75*25 mm) into the gas passage 20. In case the inner reaction tube 40 is disposed slightly off-axis, e.g. by 5 mm, such that the width of the gas passage 20 varies in the tangential direction between 20 and 30 mm, the distance over which the flow deflector 50 protrudes into the gas passage 20 may vary correspondingly, e.g. between 15 and 23 mm.

The outer and inner reaction tubes 30, 40 are normally manufactured individually, and assembled at a later stage to form the double tube structure of the furnace 1. To enable such assembly, during which the inner reaction tube 40 is carefully moved into the outer reaction tube 30, at least a few millimeters of clearance between the two components is desirable. The clearance may preferably be at least 2 millimeters, and more preferably be in the range of 2-8 millimeters. Accordingly, a flow deflector may preferably protrude radially from the wall on which it is provided over a radial distance of no more than a local width of the gas passage 20 minus at least 2 millimeters, or preferably 2-8 millimeters, depending on the desired clearance.

As mentioned, a flow deflector may comprise multiple baffles, which may be provided on the walls 32, 41 of the outer and/or inner reaction tubes 30, 40. Several embodiments of a such a flow deflector 50 will now be elucidated with reference to FIGS. 2 and 3. It is noted in advance that in the embodiments depicted in FIGS. 2-3, the baffles 52 of the flow deflector 50 are provided on the outer wall 41 of the liner 40, which liner is shown in isolation. One skilled in the art will appreciate, however, that similar patterns of baffles may alternatively, or in addition, also be provided on the inner wall 32 of the outer reaction tube 30.

FIG. 2 schematically illustrates two embodiments of a liner 40. Each embodiment features a flow deflector 50 comprising a plurality of identical baffles 52 that protrude radially from, and extend substantially tangentially along, the outer wall 41 of the liner at different axial positions. The two embodiments have a number of characteristics in common.

In both embodiments each of the baffles 52 extends tangentially along the outer wall 41 of the liner 40 through an angle α of approximately 35 degrees relative to the central axis L. It is contemplated, however, that in other embodiments the angle α of subtended by at least some of the baffles 52 may be smaller or larger than 35 degrees, e.g. be in the range of 10-90 degrees. Furthermore, the baffles 52 in both embodiments extend substantially tangentially, meaning that they do not, or at least not significantly, extend in the axial direction L. In other embodiments, however, one or more baffles 52 may extend along the outer wall 41 in a direction having both a tangential and an axial component (cf. the embodiments depicted in FIG. 3).

In either of the embodiments of FIG. 2, the baffles 52 are disposed at a discrete number (six) of equidistantly spaced apart axial positions, spread across the axial length or height of the liner 40. Consequently, when the liner 40 is incorporated in a thermal furnace 1 similar to that shown in FIG. 1, the flow deflector 50 will be approximately uniformly distributed over the length of the gas passage 20, at least such that it extends in all of three equally long axially extending portions of the gas passage 20 that together cover the total length thereof (e.g. in the depicted orientation: a bottom portion, a middle portion and a top portion of the gas passage 20).

Figure 2B:
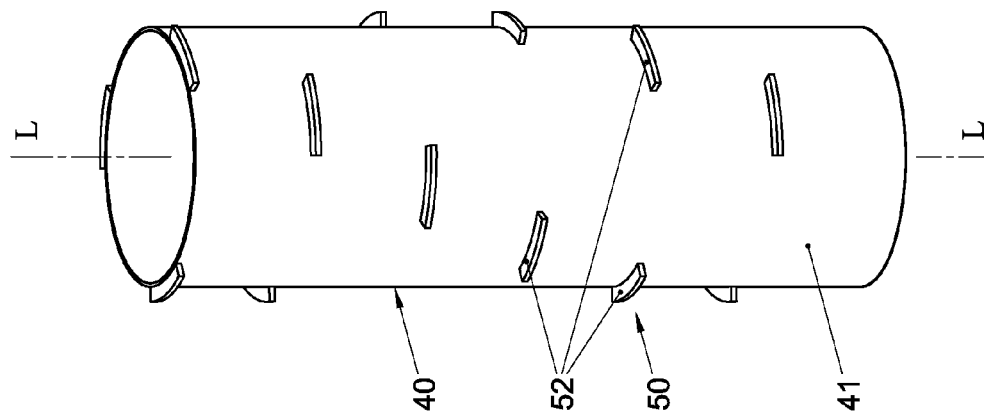
FIGS. 2A-B are schematic perspective views of respective exemplary embodiments of a liner fitted with a flow deflector that includes a plurality of substantially tangentially extending baffles, disposed at different axial positions.
Figure 2A:
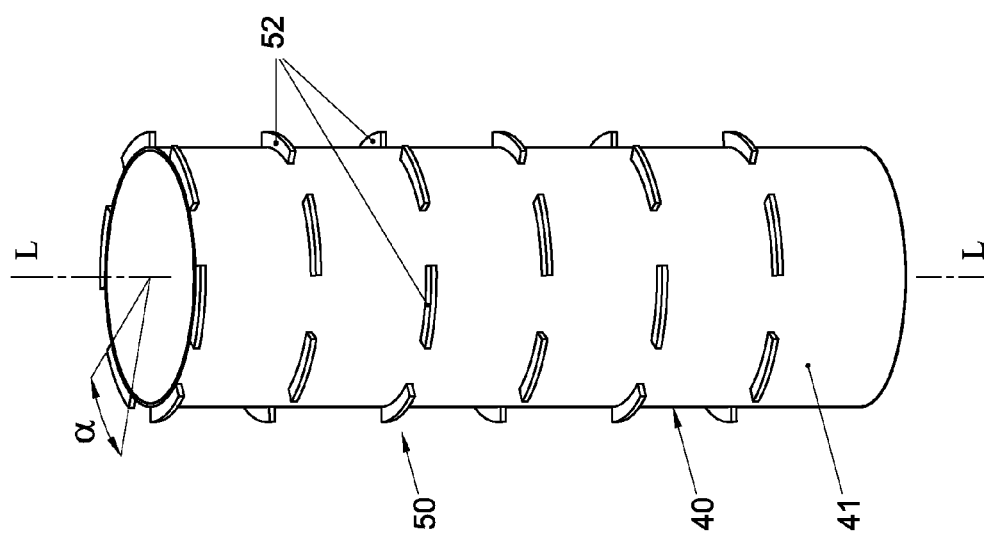

Each of the axial positions in the embodiments of FIG. 2 features a series of a same number of equidistantly tangentially spaced apart baffles 52; six and three for the embodiment of FIG. 2A and FIG. 2B, respectively. The configuration of baffles 52 at the different axial positions is thus the same, beit that a series of baffles at a certain axial position has each time been rotationally offset relative to a series of baffles at an adjacent axial position. The series of baffles 52 at different axial positions have been rotationally offset relative to each other, and may partially overlap which each other (seen in the axial direction L), in such a way that, seen in the axial direction L, the flow deflector 50—i.e. all the baffles 52 considered in conjunction—completely encircle the liner 40. In fact, they may be considered to encircle the liner 40 more than once. In the embodiment of FIG. 2 each two (axially) adjacent series of baffles 52 taken together encircle the liner 40, while in the embodiment of FIG. 3 the baffles 52 at each set of four adjacent axial positions account for one full encirclement.

Due to the fact that the flow deflector 50 is configured such that it encircles the liner 40 more than once, a gas flow traveling along the outer wall 41 of the liner 40 in the axial direction L may be obstructed several times by different baffles 52 of the flow deflector 50. Furthermore, because the flow deflector 50 is approximately uniformly distributed over the axial length of the liner 40, there is no particular axially extending portion of the outer wall 41 that is devoid of baffles 52 and that may for that reason facilitate the development of relatively strong back flows. Instead, the flow deflector 50 may be considered as somewhat of a maze made up of flow breaking/deflecting baffles 52 that scatter developing, axially directed flows that might be capable of transporting deposit.

FIG. 3 schematically illustrates another two exemplary embodiments of a liner 40 according to the present invention. Both depicted liners 40 feature a flow deflector 50 including a number of baffles 52 that extend helically along the outer wall 41 of the liner, around the central axis L. Each of the baffles 52 extends along substantially the entire axial length of the liner 40, thereby ensuring that, when the liner 40 is incorporated into a thermal furnace as shown in FIG. 1, the flow deflector 50 extends in all of three equally long axially extending portions of the gas passage 20 that together cover a total length thereof.

Figure 3B:
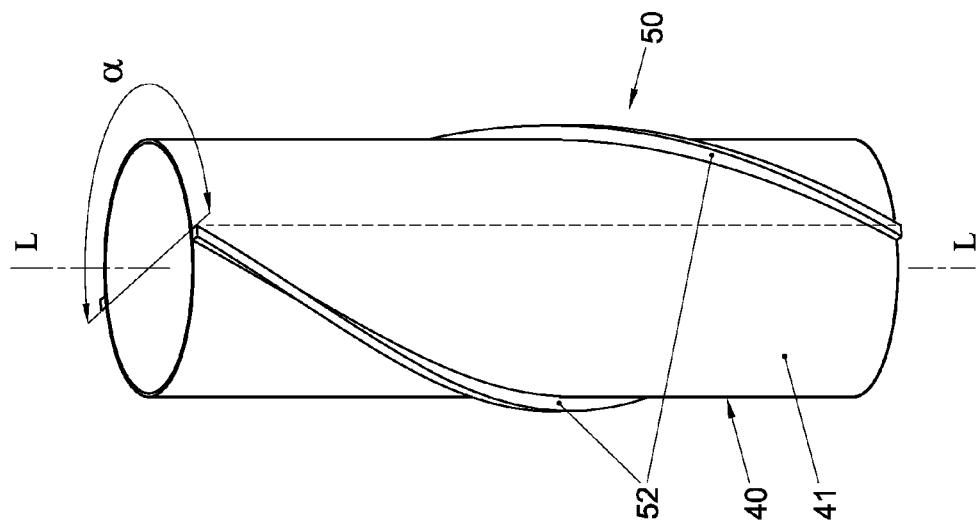
FIGS. 3A-B are schematic perspective views of respective exemplary embodiments of a liner fitted with a flow deflector that includes a number of baffles, four and two respectively, each of which baffles extends helically along the outer wall, around the central axis of the liner.
Figure 3A:
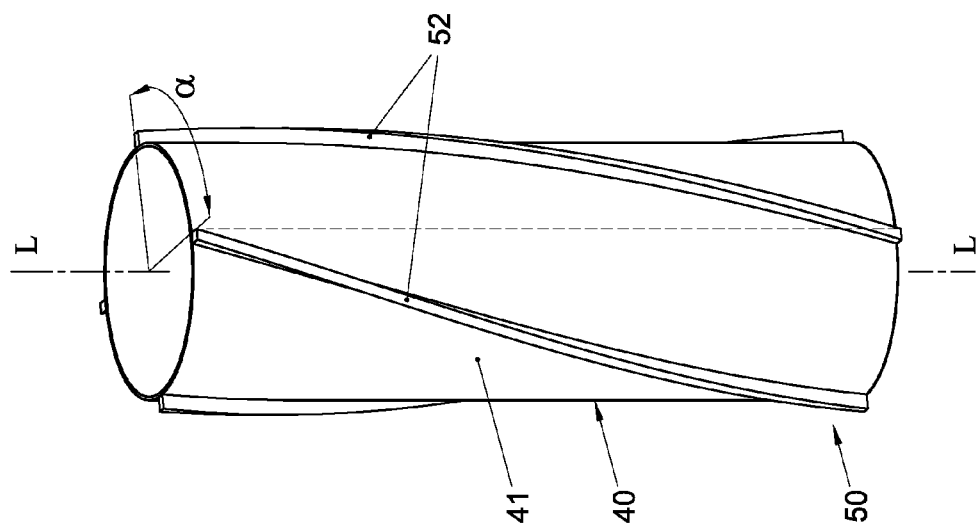

The liner 40 in the embodiment of FIG. 3A includes four baffles 52, while the liner in the embodiment of FIG. 3B includes only two baffles. The baffles 52 in either embodiment are arranged such that the flow deflector 50, seen in the direction of the central axis L, encircles the liner 40. In addition, the number of baffles 52 is in both embodiments related to the angle α subtended by a single baffle 52 with respect to the central axis L as seen in the direction of the central axis. For instance, in the four-baffle-embodiment of FIG. 3A each baffle 52 subtends an angle α of (360/4=) 90 degrees, while in the two-baffle-embodiment of FIG. 3B each baffle subtends an angle α of (360/2=) 180 degrees. In general, flow deflectors 50 including a plurality of n helically extending baffles 52, wherein each baffle subtends an angle of at least 360/n degrees with respect to the central axis L, appear quite effective in back flow prevention. They may also be manufactured economically, in particular because the number of baffles n that needs to be provided may be relatively small, e.g. four or less.

From the perspective of back flow prevention, it may be tempting to construct and employ a flow deflector 50 with a relatively large number of baffles 52. However, a larger number of baffles 52 may mean an increase in flow resistance along the exhaust path 21, which in turn may increase the demands placed on the vacuum pump 24 of a thermal processing furnace 1. Numerical simulations have shown that the increase in flow resistance caused by the presence of a modest number of helically extending baffles 52, as shown in FIG. 3 (i.e. up to and including four baffles), is relatively small and practically of no concern to most applications.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS 1 thermal processing furnace/reactor
2 reaction chamber
4 gas injector
6 gas injection holes
8 flange
10 central furnace opening
12 door plate
14 O-ring
16 gas exhaust conduit
18 gas feed conduit
20 gas passage
21 gas exhaust path
22 heating coil
24 vacuum pump
26 wafer boat
27 substrate/wafer
28 pedestal
30 outer reaction tube
31 outer wall of outer reaction tube
32 inner wall of outer reaction tube
40 inner reaction tube/liner
41 outer wall of inner reaction tube
42 inner wall of inner reaction tube
50 flow deflector
52 baffle of flow deflector
L central axis of both the inner and outer reaction tube
n number of baffles of flow deflector
α angle subtended by baffle of flow deflector

We claim:

1. A thermal processing furnace, comprising:
a generally bell jar-shaped outer reaction tube having a central axis (L);
an open-ended inner reaction tube for accommodating a wafer boat holding a plurality of substrates, which inner reaction tube is substantially coaxially disposed within the outer reaction tube, thereby defining a gas passage between an outer wall of the inner reaction tube and an inner wall of the outer reaction tube, and
a flow deflector comprising a plurality of substantially tangentially extending baffles, said plurality of baffles protruding radially from at least one of the outer wall of the inner reaction tube and the inner wall of the outer reaction tube into all of three equally long axially extending portions of the gas passage that together cover a total length thereof.

2. The thermal processing furnace according to claim 1, wherein the flow deflector—seen in the direction of the central axis (L)—encircles the inner reaction tube, such that a flow of gas through the gas passage in the direction of the central axis is obstructed at least once by said flow deflector.

3. The thermal processing furnace according to claim 1, wherein the flow deflector protrudes radially from the respective wall over a distance of at least 75% of a local width of the gas passage.

4. The thermal processing furnace according to claim 3, wherein the flow deflector protrudes radially from the respective wall over a distance of no more than a local width of the gas passage minus 2 millimeters, and preferably minus 2-8 millimeters, of clearance.

5. The thermal processing furnace according to claim 1, wherein the substantially tangentially extending baffles are arranged in series of at least two baffles, wherein the baffles of the same series extend at the same axial position, and wherein at least two series of baffles are provided at different axial positions.

6. The thermal processing furnace according to claim 1, wherein the flow deflector comprises at least one baffle that extends helically relative to the central axis (L).

7. The thermal processing furnace according to claim 6, wherein the flow deflector comprises a plurality of n baffles that extend helically relative to the central axis (L), and wherein each baffle of said plurality—seen in the direction of the central axis—subtends an angle of at least (360/n) degrees.

8. An inner reaction tube for accommodating a wafer boat holding a plurality of substrates in a thermal processing furnace, comprising:
a generally tubular wall having a central axis (L), and
a flow deflector comprising a plurality of substantially tangentially extending baffles, said baffles being provided on said tubular wall and protruding radially outwardly from all of three equally long axially extending portions of the tubular wall that together cover a total length thereof.

9. The inner reaction tube according to claim 8, wherein the flow deflector—seen in the direction of the central axis (L)—encircles the inner reaction tube.

10. The inner reaction tube according to claim 9, wherein the flow deflector comprises at least one baffle that extends helically relative to the central axis.

11. The inner reaction tube according to claim 8, wherein the flow deflector comprises a plurality of substantially tangentially extending baffles that are arranged in series of at least two baffles, wherein the baffles of the same series extend at the same axial position, and wherein at least two series of baffles are provided at different axial positions.

12. The inner reaction tube according to claim 8, wherein the flow deflector comprises at least one baffle that extends helically relative to the central axis.

13. The inner reaction tube according to claim 12, wherein the flow deflector comprises a plurality of n baffles that extend helically relative to the central axis (L), and wherein each baffle of said plurality—seen in the direction of the central axis—subtends an angle of at least (360/n) degrees.

* * * * *